United States Patent
Toyao et al.

(10) Patent No.: US 9,456,499 B2
(45) Date of Patent: Sep. 27, 2016

(54) STRUCTURAL BODY AND INTERCONNECT SUBSTRATE

(75) Inventors: Hiroshi Toyao, Tokyo (JP); Toru Taura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 572 days.

(21) Appl. No.: 13/816,690

(22) PCT Filed: Jul. 20, 2011

(86) PCT No.: PCT/JP2011/004096
§ 371 (c)(1),
(2), (4) Date: Feb. 12, 2013

(87) PCT Pub. No.: WO2012/042717
PCT Pub. Date: Apr. 5, 2012

(65) Prior Publication Data
US 2013/0140071 A1  Jun. 6, 2013

(30) Foreign Application Priority Data

Sep. 28, 2010  (JP) .................................. 2010-216567

(51) Int. Cl.
*H05K 1/11* (2006.01)
*H05K 1/18* (2006.01)
(Continued)

(52) U.S. Cl.
CPC ................. *H05K 1/18* (2013.01); *H01P 1/047* (2013.01); *H05K 1/0236* (2013.01); *H05K 1/115* (2013.01); *H05K 1/165* (2013.01); *H05K 2201/0969* (2013.01); *H05K 2201/09263* (2013.01);
(Continued)

(58) Field of Classification Search
CPC .... H05K 1/0236; H05K 1/165; H05K 1/025; H05K 1/0253; H05K 1/0225; H01P 1/2005
See application file for complete search history.

(56) References Cited

U.S. PATENT DOCUMENTS 4,845,311 A * 7/1989 Schreiber .................. H01P 3/06
156/47
5,451,917 A    9/1995 Yamamoto et al.
(Continued)

FOREIGN PATENT DOCUMENTS

CN     101065879 A    10/2007
JP     H07-193401 A   7/1995
JP     2010-010183 A  1/2010

OTHER PUBLICATIONS

International Search Report (ISR) (PCT Form PCT/ISA/210), in PCT/JP2011/004096, dated Aug. 23, 2011.
(Continued)

*Primary Examiner* — Steven T Sawyer
(74) *Attorney, Agent, or Firm* — McGinn IP Law Group, PLLC

(57) ABSTRACT

A structural body includes a first conductor having a first opening; a second conductor, having a second opening, which is opposite to at least a portion of the first conductor; a conductor via, passing through the first opening and the second opening, which is insulated from the first conductor and the second conductor; a first interconnect, provided in the inside of the first opening, of which one end thereof is connected to the conductor via and the other end thereof is formed as an open end and which is opposite to the second conductor; and a second interconnect, provided in the inside of the second opening, of which one end thereof is connected to the conductor via and the other end thereof is formed as an open end, and which is opposite to the first conductor.

17 Claims, 16 Drawing Sheets

(51) Int. Cl.
  *H05K 1/02* (2006.01)
  *H01P 1/04* (2006.01)
  *H05K 1/16* (2006.01)
(52) U.S. Cl.
  CPC ............... *H05K2201/09663* (2013.01); *H05K 2201/09781* (2013.01); *H05K 2201/09972* (2013.01)

(56) References Cited

U.S. PATENT DOCUMENTS 8,299,876 B2* 10/2012 Lin ..................... H01P 1/20345
                                                          333/204
2005/0098348 A1* 5/2005 Okumichi et al. ............ 174/262
2005/0195051 A1    9/2005 McKinzie
2007/0285188 A1* 12/2007 Song ..................... H01Q 15/006
                                                          333/12
2009/0315648 A1* 12/2009 Toyao ........................... 333/238
2011/0031007 A1*  2/2011 Kim et al. ..................... 174/377

OTHER PUBLICATIONS

Chinese Office Action dated Dec. 25, 2014 with a partial English translation.

* cited by examiner

FIG. 11
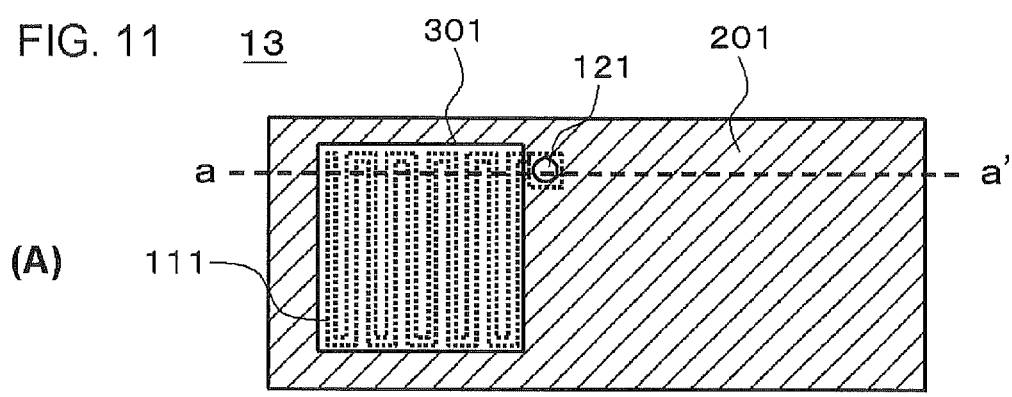
(A)
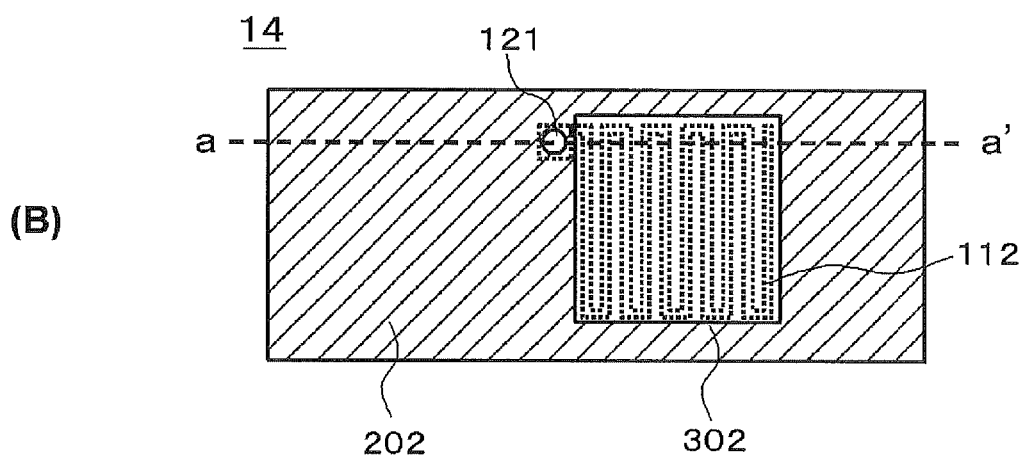
(B)

FIG. 16

| | Mechanically-Unbalanced | Mechanically-Balanced |
|---|---|---|
| Internal | Internal "T"<br>US Pat. 5,886,597 | Internal "double T"<br>US Pat. 6,542,342<br><br>Internal "I" |
| External | External "T"<br>US Pat. 5,886,597 | External "I" |
| Hybrid | | Hybrid "I" |

STRUCTURAL BODY AND INTERCONNECT SUBSTRATE

TECHNICAL FIELD

The present invention relates to a structural body and an interconnect substrate.

BACKGROUND ART

In recent years, it has been obvious that the propagation characteristics of electromagnetic waves are able to be controlled by periodically disposing conductor patterns having a specific structure (hereinafter, referred to as a "metamaterial"). Particularly, a metamaterial formed so as to suppress the propagation of electromagnetic waves in a specific frequency band is called an electromagnetic band gap structure (hereinafter, referred to as an "EBG structure"), and an attempt to suppress noise propagation between a power plane and a ground plane by applying the EBG structure to an interconnect substrate has been reported.

For example, Patent Document 1 (Specification of U.S. Patent Application Publication No. 2005/0195051) discloses a so-called mushroom-type EBG structure, as shown in FIG. 16, in which a plurality of insular conductor elements are disposed on a layer between two conductor planes opposite to each other and each of the insular conductor elements is connected to a conductor plane through a via, and a modified example thereof.

RELATED DOCUMENT

Patent Document

[Patent Document 1] Specification of U.S. Patent Application Publication No. 2005/0195051

DISCLOSURE OF THE INVENTION

In the above-mentioned mushroom-type EBG structure, it is necessary to provide a layer on which a conductor element is disposed (hereinafter, referred to as a "conductor element layer") in addition to a layer on which conductor planes opposite to each other are disposed. Particularly, in the case of an EBG structure in which any of the two conductor planes opposite to each other is not connected to a via, that is, in the case of an EBG structure surrounded by the dotted line in FIG. 16, it is necessary to provide two conductor element layers.

For this reason, there is a problem in that a structural body having an EBG structure in the related art (hereinafter, referred to as the "EBG structural body") in which any of two conductor planes opposite to each other is not connected to a via contains a large number of laminations and thus the thickness thereof increases.

In addition, when the EBG structure in the related art in which any of two conductor planes opposite to each other is not connected to a via is applied to an interconnect substrate, there is a problem in that the interconnect substrate contains a large number of laminations and thus the thickness of the interconnect substrate increases.

Further, the manufacturing costs of the EBG structural body and the interconnect substrate increase due to the large number of laminations.

The invention is contrived in view of such circumstances, and an object thereof is to provide an EBG structural body and an interconnect substrate which are capable of realizing a further reduction in thickness and a further reduction in cost than those of an EBG structural body having an EBG structure in the related art and an interconnect substrate, by realizing an EBG structure with a number of layers smaller than that of the EBG structure in the related art in an EBG structure which includes two conductor planes opposite to each other, a via, and a conductor element connected to the via, and in which any of two conductor planes is not connected to the via.

According to the invention, there is provided a structural body including: a first conductor having a first opening; a second conductor, having a second opening, which is opposite to at least a portion of the first conductor; a conductor via, passing through the first opening and the second opening, which is insulated from the first conductor and the second conductor; a first interconnect, provided in the inside of the first opening, of which one end thereof is connected to the conductor via and the other end thereof is formed as an open end, and which is opposite to the second conductor; and a second interconnect, provided in the inside of the second opening, of which one end thereof is connected to the conductor via and the other end thereof is formed as an open end, and which is opposite to the first conductor.

In addition, according to the invention, there is provided an interconnect substrate including a laminated structure formed including an electric conductor and a dielectric, wherein the interconnect substrate includes at least one of the above-mentioned structural bodies within the laminated structure.

According to the invention, it is possible to realize an EBG structure with a number of layers smaller than that of the EBG structure in the related art in the EBG structure which includes two conductor planes opposite to each other, a via, and a conductor element connected to the via, and in which any of two conductor planes is not connected to the via. As a result, according to the invention, it is possible to provide an EBG structural body and an interconnect substrate which are capable of realizing a further reduction in thickness and a further reduction in cost than those of the EBG structural body having an EBG structure in the related art and the interconnect substrate.

BRIEF DESCRIPTION OF THE DRAWINGS

The above-mentioned objects, other objects, features and advantages will be made clearer from the preferred embodiments described below, and the following accompanying drawings.

FIG. 11 is a top view illustrating an example of the structural body according to the third embodiment.

FIG. 16 is a diagram illustrating an EBG structure in the related art.

DESCRIPTION OF EMBODIMENTS

Figure 1:
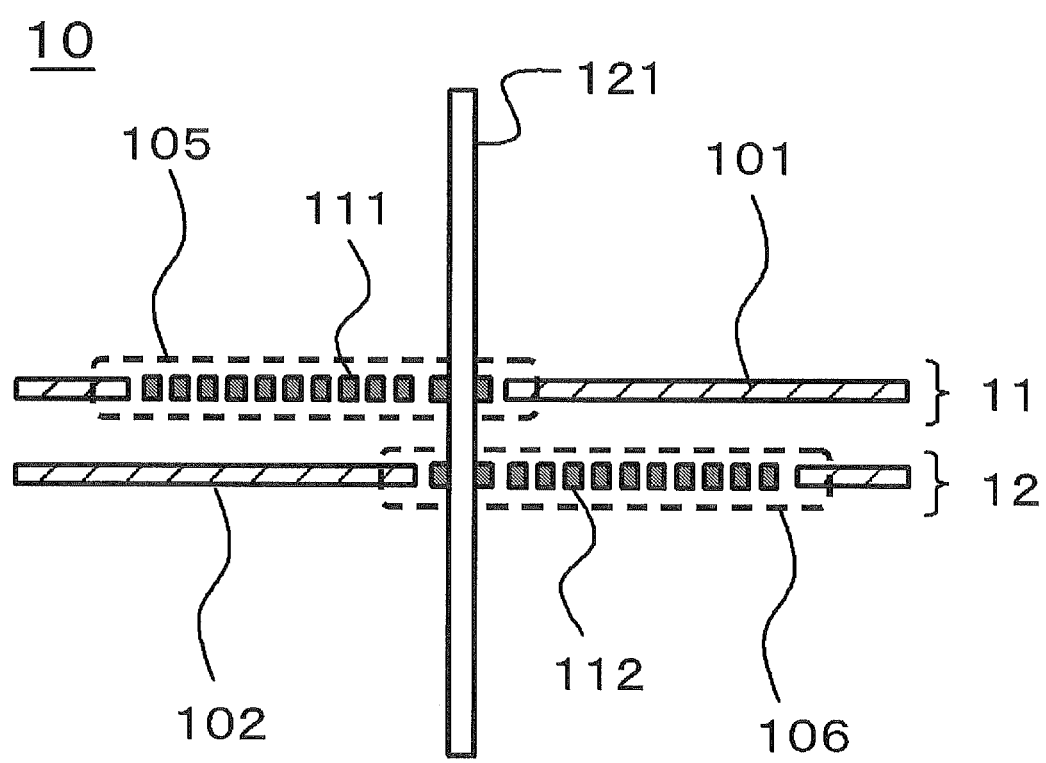
FIG. 1 is a cross-sectional view illustrating an example of a structural body according to a first embodiment.

Hereinafter, the embodiments of the invention will be described with reference to the accompanying drawings. In all the drawings, like elements are referenced by like reference numerals and signs and descriptions thereof will not be repeated.

<First Embodiment>

Figure 2:
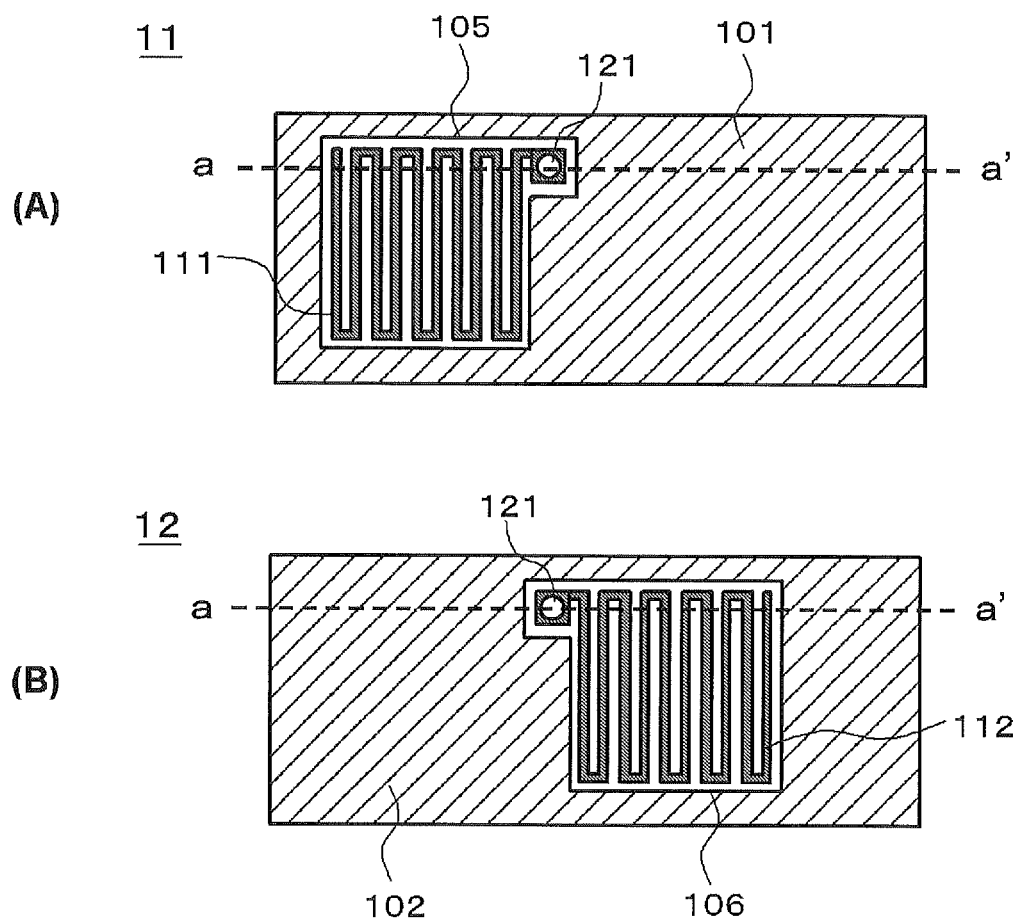
FIG. 2 is a top view illustrating an example of the structural body according to the first embodiment.

FIG. 1 is a cross-sectional view illustrating an example of a structural body 10 according to a first embodiment of the invention. FIG. 2 is a top view illustrating an example of the structural body 10 according to the first embodiment of the invention, FIG. 2(A) is a top view in an A layer 11, and FIG. 2(B) is a top view in a B layer 12. FIG. 1 is equivalent to a cross-sectional view taken along the line a-a' in FIG. 2.

As shown in FIG. 1, the structural body 10 includes a first conductor 101, a second conductor 102, a first opening 105 and a second opening 106 which are provided in each of the first conductor 101 and the second conductor 102, a first interconnect 111 and a second interconnect 112 which are provided in each of the inside of the first opening 105 and the inside of the second opening 106, and a conductor via 121, passing through the first opening 105 and the second opening 106, which is insulated from the first conductor 101 and the second conductor 102.

The structural body 10 having such components can be constituted by, for example, various types of conductive components formed in an interconnect substrate.

Hereinafter, the structural body 10 will be described in detail.

The structural body 10 shown in FIG. 1 includes the first conductor 101 provided in the A layer 11 and the second conductor 102 provided in the B layer 12 located below the A layer 11. The first conductor 101 and the second conductor 102 are disposed so that at least portions thereof are opposite to each other, for example, with a dielectric interposed therebetween.

At least one first opening 105 is provided in the first conductor 101, and at least one first interconnect 111 is provided in the inside of the first opening. In addition, at least one second opening 106 is provided in the second conductor 102, and at least one second interconnect 112 is provided in the inside of the second opening. Further, the structural body 10 includes at least one conductor via 121, passing through the first opening 105 and the second opening 106, which is insulated from the first conductor 101 and the second conductor 102.

The first interconnect 111 is formed opposite to the second conductor 102, for example, with a dielectric interposed therebetween, and is configured such that one end thereof is connected to the conductor via 121 and the other end thereof is formed as an open end. In addition, the second interconnect 112 is formed opposite to the first conductor 101, for example, with a dielectric interposed therebetween, and is configured such that one end thereof is connected to the conductor via 121 and the other end thereof is formed as an open end.

The first conductor 101, the second conductor 102, the first interconnect 111, the second interconnect 112, and the conductor via 121 can be formed of a copper foil, but may be formed of other materials insofar as they are conductive. In addition, each of them may be formed of the same material, and may be formed of a different material.

Meanwhile, when the structural body 10 is constituted by various types of conductive components formed in the interconnect substrate, the first conductor 101 and the first interconnect 111 are provided on the same layer as the interconnect substrate having a laminated structure. In addition, the second conductor 102 and the second interconnect 112 are provided on the same layer as the interconnect substrate having a laminated structure.

In addition, the structural body 10 may include layers other than the A layer 11 and the B layer 12 mentioned above. For example, a dielectric layer may be located between the A layer 11 and the B layer 12. In addition, the structural body 10 may include a hole, a via, a signal line and the like which are not shown, somewhere else, in the range consistent with the configuration of the invention.

Further, the first opening 105 and the second opening 106 are not necessarily hollow, but a dielectric may be filled in the inside thereof. That is, a dielectric may be filled in regions other than a region in which each of the first interconnect 111 and the second interconnect 112 within the first opening 105 and the second opening 106 is located.

In the structural body 10, the first conductor 101 or the second conductor 102 may be connected to a power supply terminal of an electronic element such as an LSI, and may be caused to function as a power plane providing a power supply potential to the electronic element. Alternatively, the first conductor 101 or the second conductor 102 may be connected to a ground terminal of an electronic element such as an LSI, and may be caused to function as a ground plane providing a ground potential to the electronic element.

Next, the effects and operations of the embodiment will be described.

Figure 3:
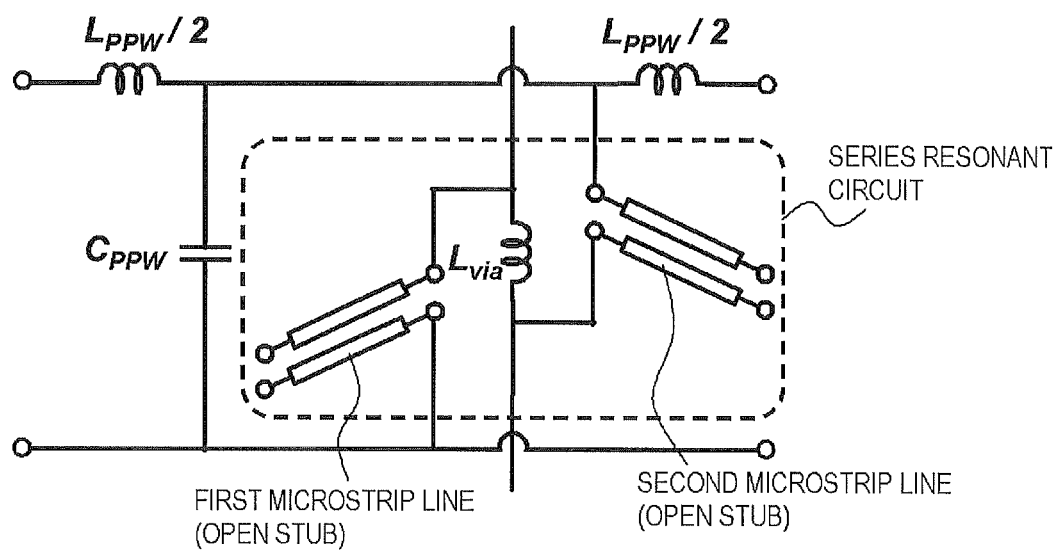
FIG. 3 is an equivalent circuit diagram illustrating the structural body according to the first embodiment.

FIG. 3 shows an equivalent circuit of the structural body 10 shown in FIGS. 1 and 2. The first conductor 101 and the second conductor 102 are opposite to each other, and thus a parallel plate waveguide expressed in inductance $L_{PPW}$ and capacitance $C_{PPW}$ is formed. In addition, the first interconnect 111 is electrically coupled to the second conductor 102 opposite thereto, and forms a first microstrip line using the second conductor 102 as a return path. Similarly, the second interconnect 112 is electrically coupled to the first conductor 101 opposite thereto, and forms a second microstrip line using the first conductor 101 as a return path. The first microstrip line and the second microstrip line have an open end, and operate as an open stub. As shown in FIG. 3, the first and second microstrip lines and inductance $L_{via}$ which is formed by the conductor via 121 form a series resonant circuit.

In the structural body 10, the above-mentioned parallel plate is shunted by the above-mentioned series resonant circuit, to thereby form a unit cell of a so-called "open stub-type EBG structure", and the resonance frequency of the above-mentioned series resonant circuit provides a center frequency of a band gap. Particularly, when a value of the inductance $L_{via}$ is negligibly small, the resonance frequency is provided at a frequency in which the length of the microstrip line is approximately ¼ of the wavelength. Therefore, the band gap zone can shift to a lower frequency by increasing the lengths of the first microstrip line and the second microstrip line which operate as an open stub.

According to the embodiment, the parallel plate waveguide formed including the first conductor 101 and the second conductor 102 constitutes an EBG structure together with the first interconnect 111, the second interconnect 112 and the conductor via 121, and thus noise propagation in the above-mentioned parallel plate waveguide can be suppressed. In addition, even when any of the first conductor 101 and the second conductor 102 is not connected to the conductor via 121, it is possible to form an EBG structure with a number of layers smaller than that of an EBG structure in the related art (see FIG. 16). For this reason, it is possible to realize an EBG structural body and an interconnect substrate which are capable of realizing a further reduction in thickness and a further reduction in cost than those of the EBG structural body having an EBG structure in the related art (see FIG. 16) and the interconnect substrate.

Meanwhile, the first interconnect 111 forming the first microstrip line and the second conductor 102 opposite to the first interconnect 111 are preferably close to each other. The second interconnect 112 forming the second microstrip line and the first conductor 101 opposite to the second interconnect 112 are preferably close to each other. This is because as the distance between the conductors which are opposite to the interconnect decreases, the characteristic impedance of the microstrip line becomes lower, and thus the band gap zone can be widened. However, even when the first interconnect 111 is not brought close to the second conductor 102 opposite thereto, the essential effect of the invention is not influenced at all. In addition, even when the second interconnect 112 is not brought close to the first conductor 101 opposite thereto, the essential effect of the invention is not influenced at all.

Figure 4:
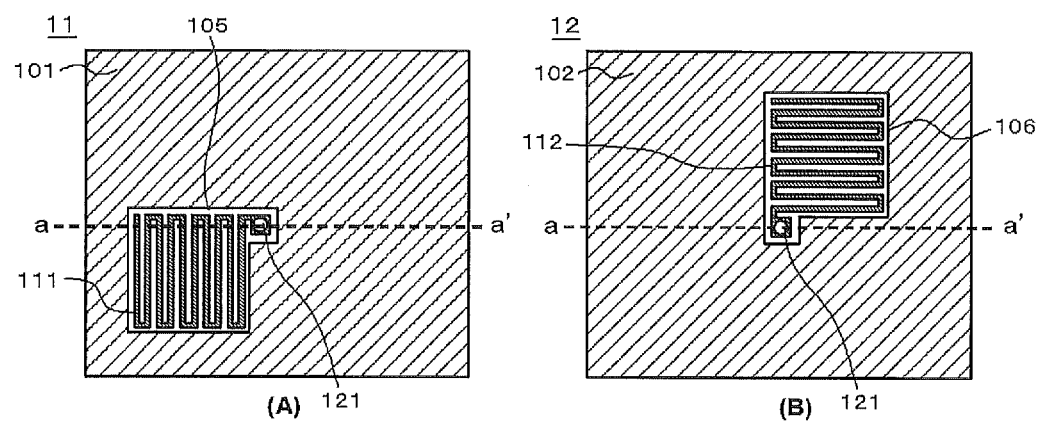
FIG. 4 is a top view illustrating an example of the structural body according to the first embodiment.

In addition, in FIGS. 1 and 2, as an example of the structural body 10, a case is shown in which the first interconnect 111 and the first opening 105, and the second interconnect 112 and the second opening 106 are arranged in mirror symmetry with respect to the surface perpendicular to the section a-a' when seen in a top view. However, when the first interconnect 111 and the second interconnect 112 are electrically coupled to the second conductor 102 and the first conductor 101 which are opposite thereto and form a microstrip line, they may be arranged in any way, and the arrangement is not necessarily limited to those in FIGS. 1 and 2. For example, the arrangement as shown in FIG. 4 may be used.

Figure 5:
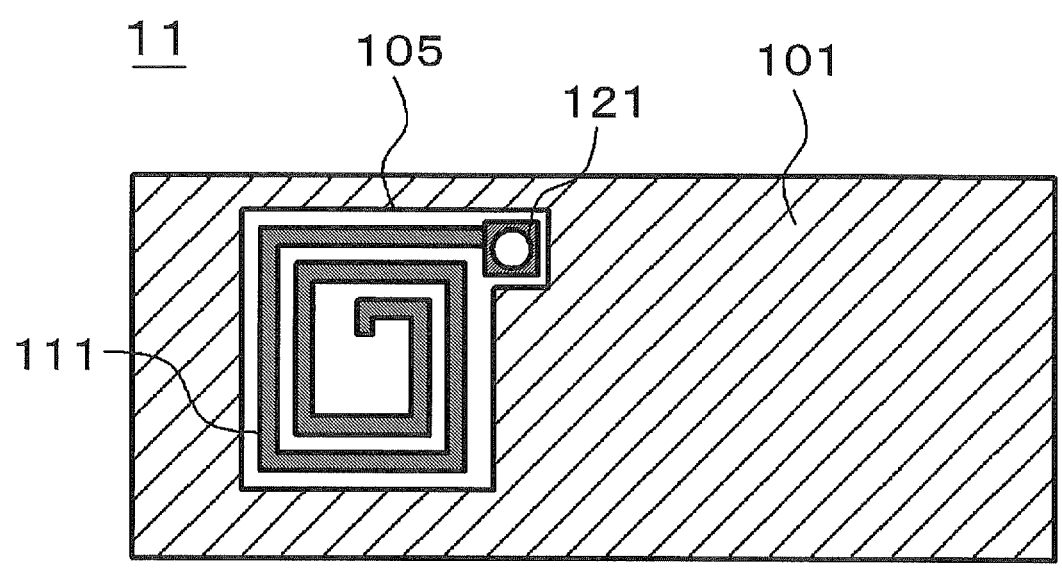
FIG. 5 is a top view illustrating an example of the structural body according to the first embodiment.
Figure 6:
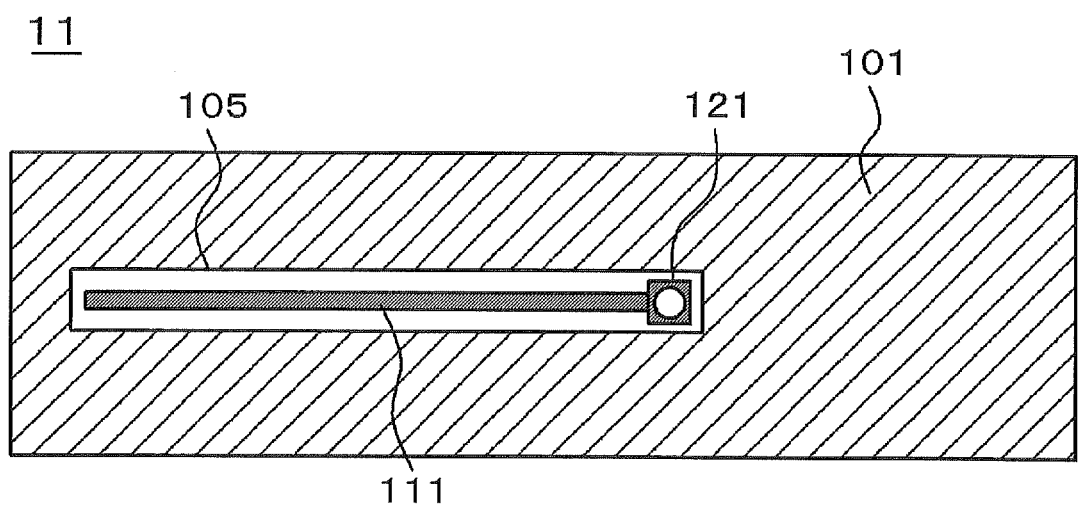
FIG. 6 is a top view illustrating an example of the structural body according to the first embodiment.

Further, in FIGS. 1 and 2, as an example of the structural body 10, a case is shown in which the first interconnect 111 and the second interconnect 112 are formed in a meandering shape. However, when the first interconnect 111 and the second interconnect 112 are configured to form a microstrip line having a required line length, they may be formed in any shape, and is not necessarily limited to a meandering shape. For example, the first interconnect 111 and the second interconnect 112 may be formed in a spiral shape, and may be formed in a linear shape. FIG. 5 shows an example in which the first interconnect 111 is formed in a spiral shape, and FIG. 6 shows an example in which the first interconnect 111 is formed in a linear shape. In addition, for example, as the first interconnect 111 is formed in a meandering shape and the second interconnect 112 is formed in a linear shape, the shapes of the first interconnect 111 and the second interconnect 112 are different from each other.

Figure 7:
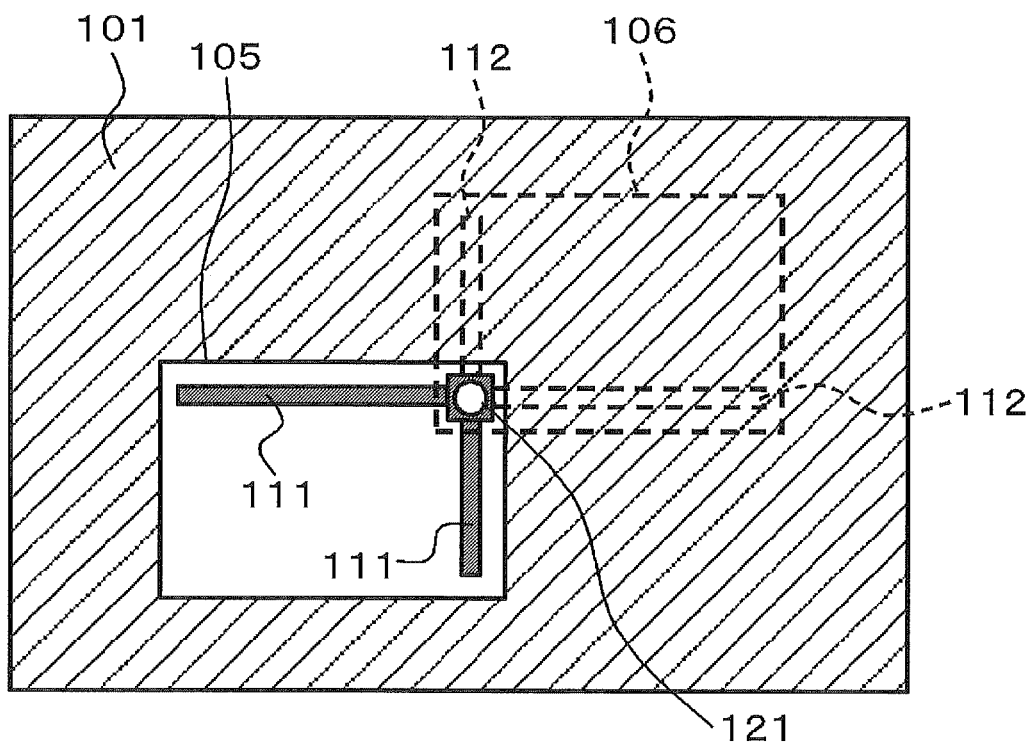
FIG. 7 is a top view illustrating an example of the structural body according to the first embodiment.

In addition, at least one set of a plurality of first interconnects 111 provided in the inside of the first opening 105 and a plurality of second interconnects 112 provided in the inside of the second opening 106 may be disposed in the inside of each opening. Particularly, as shown in FIG. 7, when the lengths of a plurality of interconnects within the same opening are configured to be different from each other, each of the interconnects causes resonance at a different frequency, and thus the band gap can be divided into multi-bands. In FIG. 7, an example is shown in which the lengths of two first interconnects 111 within the first opening 105 are different from each other, and the lengths of two second interconnects 112 within the second opening 106 are different from each other.

Figure 8:
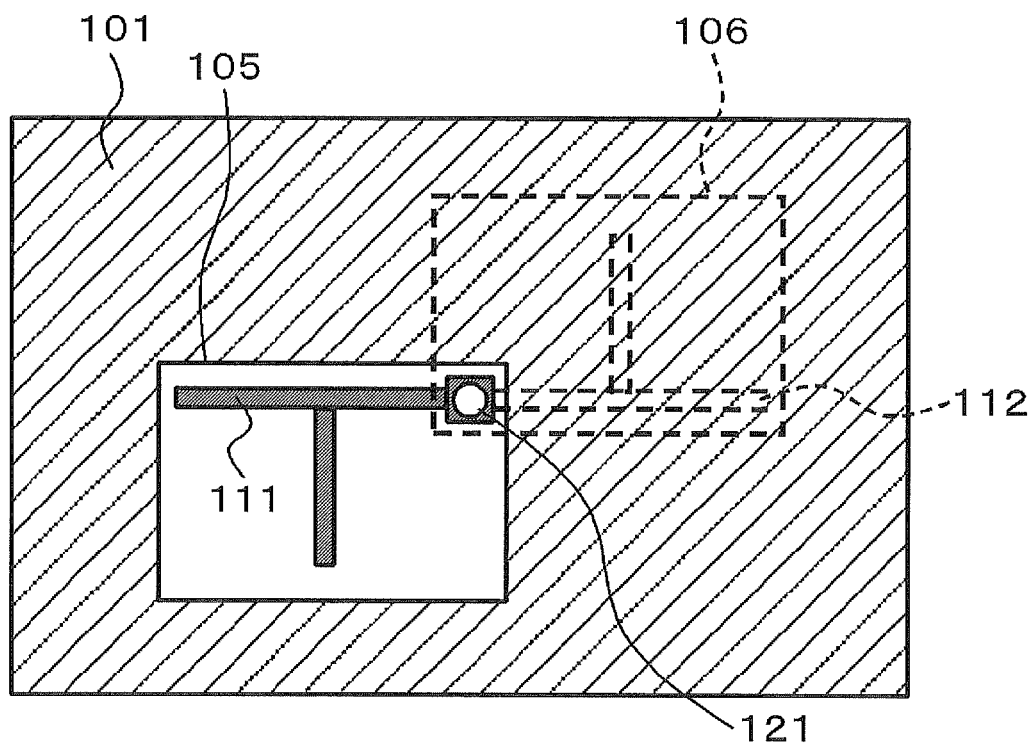
FIG. 8 is a top view illustrating an example of the structural body according to the first embodiment.

In addition, at least one of the first interconnect 111 and the second interconnect 112 may be configured to have a plurality of branches. FIG. 8 shows an example in which each of the first interconnect 111 and the second interconnect 112 has one branch. In this case, the band gap can be divided into multi-bands similarly. Meanwhile, at least a portion of a plurality of first interconnects 111 and second interconnects 112 disposed in the inside of each of the first opening 105 and the second opening 106 as shown in FIG. 7 may have a branch as shown in FIG. 8.

In addition, in FIGS. 1 and 2, a configuration is shown in which the conductor via 121 of the structural body 10 is formed by a through via. In this case, even when the conductor via 121 is connected to other elements, included in the interconnect substrate, in layers other than the A layer 11 and the B layer 12, the essential effect of the invention is not influenced at all. In addition, the conductor via 121 can also be formed by a non-through via which does not pass through the upper side of the A layer 11 and does not pass through the lower side of the B layer 12.

When the interconnect substrate having the structural body 10 is a multilayer substrate capable of forming the structural body 10, any material and process may be used. For example, the interconnect substrate may be a printed substrate using a glass epoxy resin, may be an interposer substrate such as an LSI, may be a module substrate using a ceramic material such as low temperature co-fired ceramics (LTCC), and may naturally be a semiconductor substrate such as silicon.

<Second Embodiment>

Figure 9:
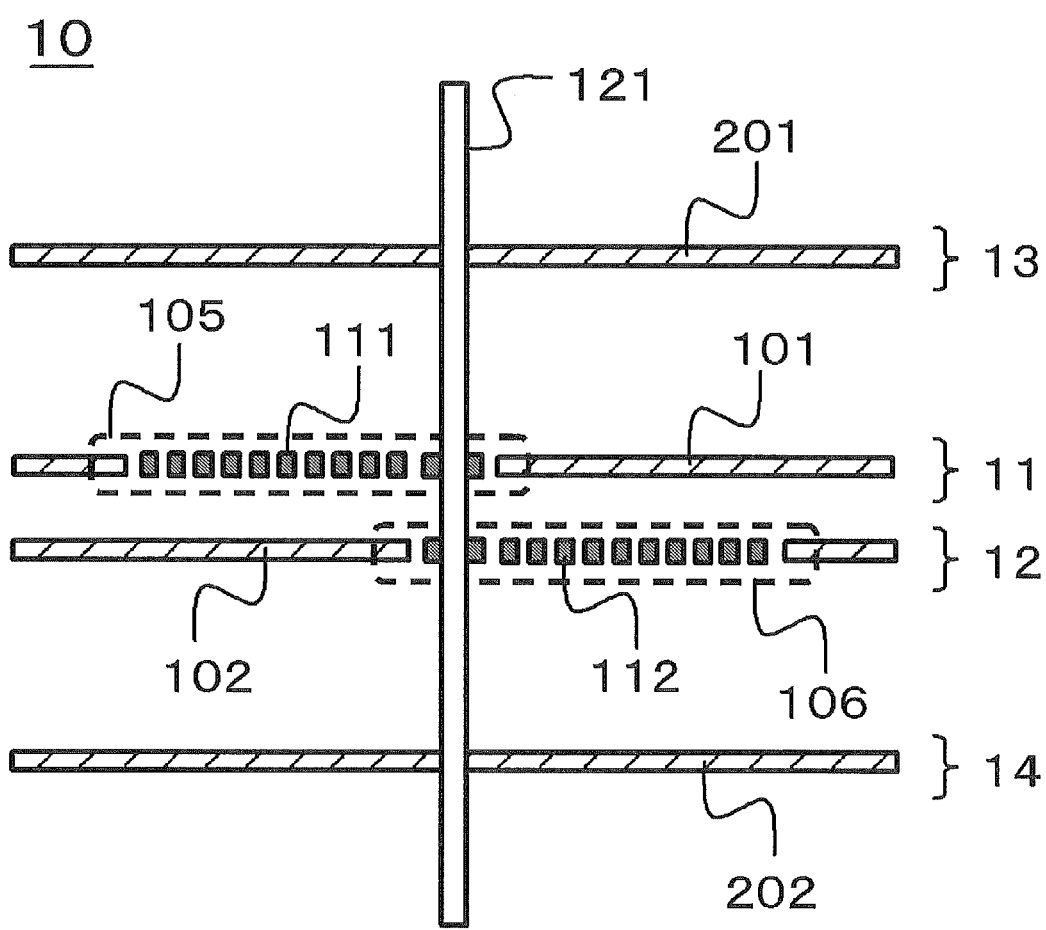
FIG. 9 is a cross-sectional view illustrating an example of a structural body according to a second embodiment.

FIG. 9 is a cross-sectional view illustrating an example of a configuration of the structural body 10 according to a second embodiment of the invention. The second embodiment has the same configuration as that of the structural body 10 according to the first embodiment, except that a third conductor 201 and a fourth conductor 202 are included.

Hereinafter, the structural body 10 will be described in detail. Meanwhile, a description of the same configuration as that of the first embodiment will be not repeated.

First, the third conductor 201 is disposed in a C layer 13 located above the A layer 11, and at least a portion thereof is opposite to the first conductor 101, for example, with a dielectric interposed therebetween. In addition, the third conductor 201 is connected to the conductor via 121.

Similarly, the fourth conductor 202 is disposed in a D layer 14 located below the B layer 12, and at least a portion thereof is opposite to the second conductor 102, for example, with a dielectric interposed therebetween. In addition, the fourth conductor 202 is connected to the conductor via 121.

In the embodiment, it is also possible to obtain completely the same effect as that in the first embodiment. Further, according to the embodiment, it is possible to suppress noise propagation in a parallel plate waveguide formed including the third conductor 201 and the first conductor 101. In addition, according to the embodiment, it is possible to suppress noise propagation in a parallel plate waveguide formed including the fourth conductor 202 and the second conductor 102.

In the structural body 10, the third conductor 201 or the fourth conductor 202 may be connected to a ground terminal of an electronic element such as an LSI, and may be caused to function as a ground plane providing a ground potential to the electronic element. In this case, it is preferable that the first conductor 101 or the second conductor 102 be connected to a power supply terminal of the electronic element, and be caused to function as a power plane providing a power supply voltage to the electronic element. However, even when any potential is provided to the first conductor 101, the second conductor 102, the third conductor 201, and the fourth conductor 202, the essential effect of the invention is not influenced at all.

Meanwhile, the structural body 10 may include layers other than the C layer 13, the A layer 11, the B layer 12, and the D layer 14 mentioned above. For example, a dielectric layer may be provided between the C layer 13 and the A layer 11, between the A layer 11 and the B layer 12, and between the B layer 12 and the D layer 14. In addition, the structural body 10 may include a hole, a via, a signal line and the like which are not shown, somewhere else, in the range consistent with the configuration of the invention.

In FIG. 9, a configuration is shown in which the conductor via 121 of the structural body 10 is formed by a through via. In this case, even when the conductor via 121 is connected to other elements in layers other than the C layer 13, the A layer 11, the B layer 12, and the D layer 14, the essential effect of the invention is not influenced at all. In addition, similarly to the first embodiment, the conductor via 121 can also be formed by a non-through via.

In addition, in FIG. 9, a configuration is shown in which the third conductor 201 and the fourth conductor 202 are included, but both the conductors are not necessarily included. For example, a configuration in which the third conductor 201 is included and the fourth conductor 202 is not included or a configuration in which the fourth conductor 202 is included and the third conductor 201 is not included can also be made.

<Third Embodiment>

Figure 10:
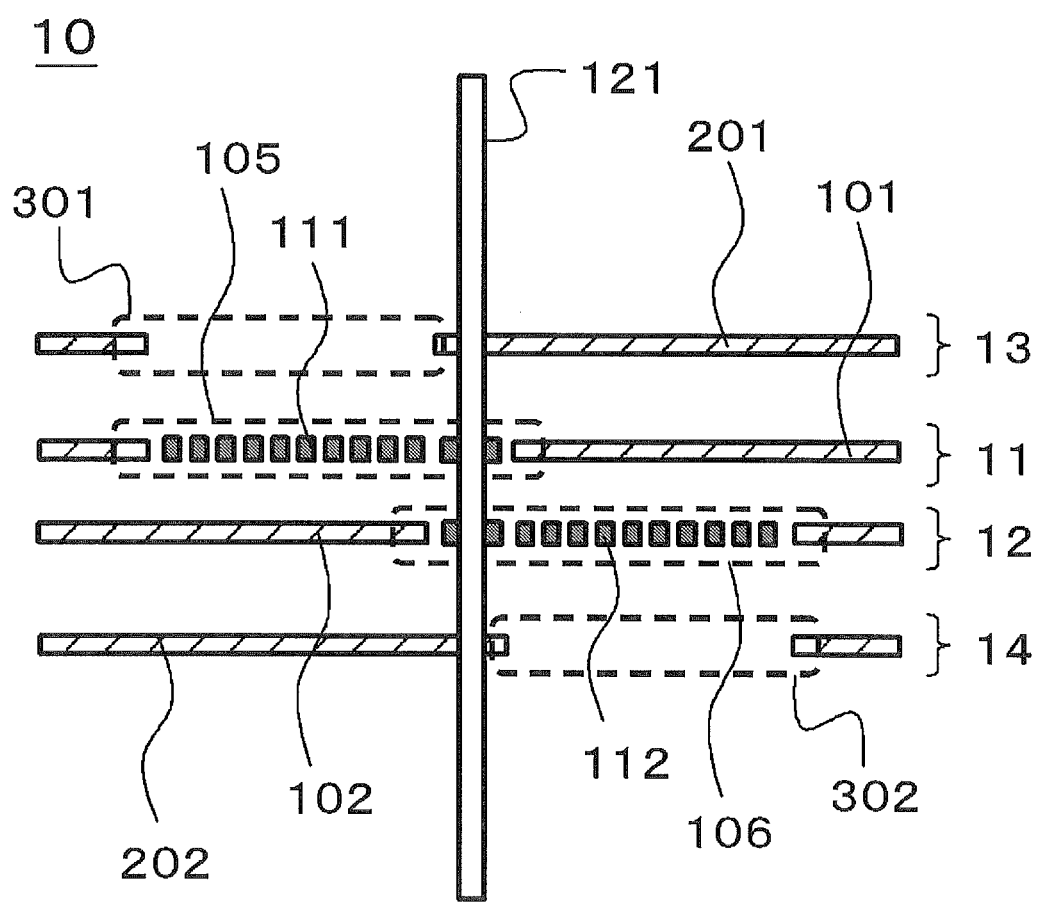
FIG. 10 is a cross-sectional view illustrating an example of a structural body according to a third embodiment.

FIG. 10 is a cross-sectional view illustrating an example of a configuration of the structural body 10 according to a third embodiment of the invention. FIG. 11 is a top view illustrating an example of the structural body 10 according to the third embodiment of the invention. FIG. 11(A) is a top view in the C layer 13, and FIG. 11(B) is a top view in the D layer 14. FIG. 10 is equivalent to a cross-sectional view taken along the line a-a' in FIG. 11.

The third embodiment has the same configuration as that of the structural body 10 according to the second embodiment, except that the third conductor 201 and the fourth conductor 202 have an opening.

As shown in FIGS. 10 and 11(A), the third conductor 201 includes a third opening 301 in a region overlapping the first interconnect 111 when seen in a plan view. In FIG. 11(A), in order to show the positional relationship between the first interconnect 111 and the third opening 301, the first interconnect 111 which is not present in the C layer 13 is shown by the dotted line.

In addition, as shown in FIGS. 10 and 11(B), the fourth conductor 202 includes a fourth opening 302 in a region overlapping the second interconnect 112 when seen in a plan view. In FIG. 11(B), in order to show the positional relationship between the second interconnect 112 and the fourth opening 302, the second interconnect 112 which is not present in the D layer 14 is shown by the dotted line.

In the embodiment, it is also possible to obtain completely the same effect as that in the second embodiment. In addition, in the second embodiment, when the interlayer distance between the C layer 13 in which the third conductor 201 is located and the A layer 11 in which the first interconnect 111 is located is small, and the electrical coupling of the first interconnect 111 to the third conductor 201 is not negligible, the first interconnect 111 does not operate as an ideal microstrip line, and thus a design becomes difficult. On the other hand, in the structural body 10 according to the third embodiment, the first interconnect 111 operates as an ideal microstrip line due to the third opening 301 provided in the third conductor 201, and thus a design can be facilitated on the basis of the equivalent circuit of FIG. 3. Completely the same relationship is also established with respect to the fourth conductor 202 and the second interconnect 112.

<Fourth Embodiment>

A fourth embodiment is an embodiment in which the structural body 10 described in the first embodiment is constituted by various types of conductive components formed in an interconnect substrate 100.

Hereinafter, the interconnect substrate 100 having the structural body 10 will be described in detail. Meanwhile, a description of the same configuration as that of the first embodiment will not be repeated.

Figure 12:
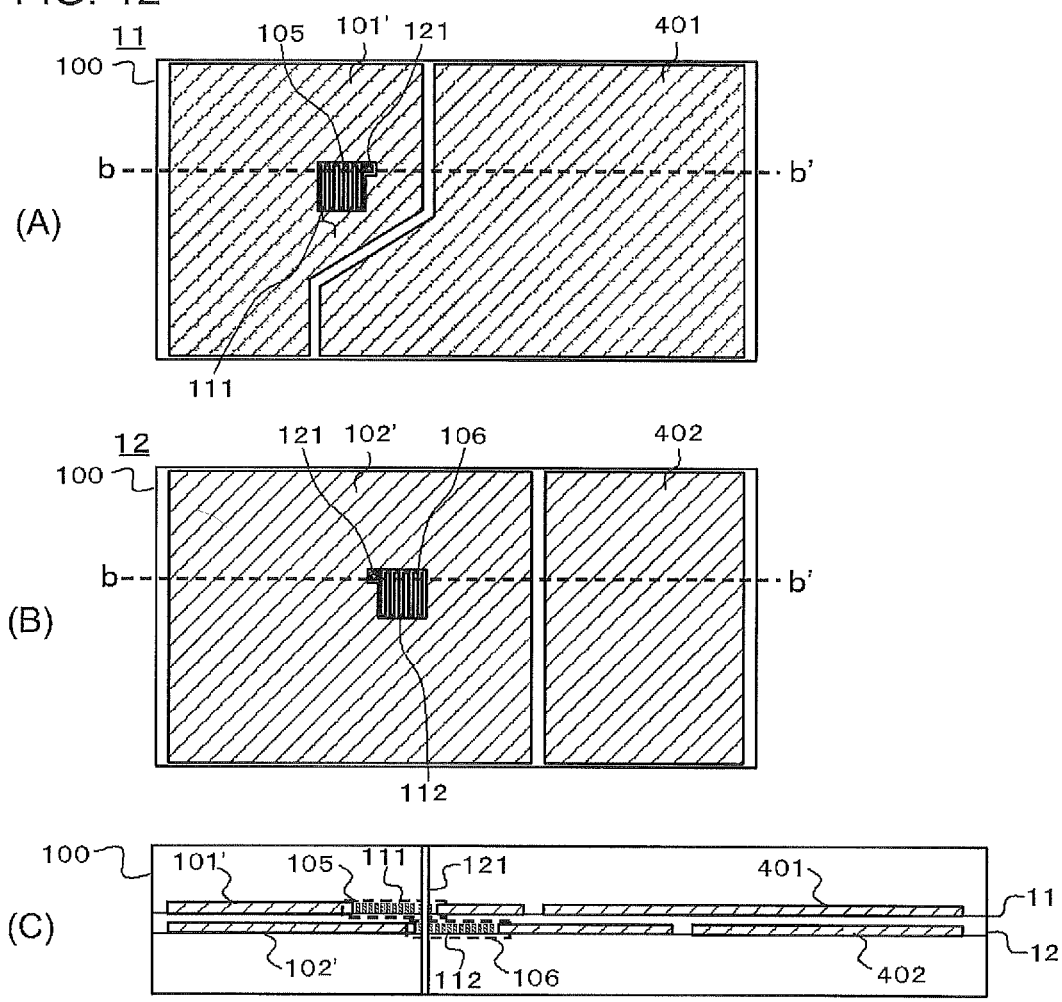
FIG. 12 is a cross-sectional view and a top view illustrating an example of an interconnect substrate according to a fourth embodiment.

FIG. 12 is a top view and a cross-sectional view illustrating an example of the interconnect substrate 100 according to the fourth embodiment. More specifically, FIG. 12(A) is a top view illustrating the A layer 11 of the interconnect substrate 100, and FIG. 12(B) is a top view illustrating the B layer 12 of the interconnect substrate 100. FIG. 12(C) is a cross-sectional view in the section b-b' shown in FIGS. 12(A) and 12(B).

As shown in FIG. 12, the interconnect substrate 100 according to the embodiment is configured such that a first power plane 101' and a second power plane 401 are disposed in the A layer 11. The first power plane 101' and the second power plane 401 are insulated from each other. In addition, a third power plane 102' and a fourth power plane 402 are disposed in the B layer 12 located below the A layer 11. The third power plane 102' and the fourth power plane 402 are insulated from each other.

Meanwhile, the first power plane 101' is equivalent to the first conductor 101 in the first embodiment, and the third power plane 102' is equivalent to the second conductor 102 in the first embodiment. That is, the first power plane 101' has the first opening 105 similarly to the first conductor 101, and the first interconnect 111 is provided in the inside of the first opening 105. In addition, the third power plane 102' has the second opening 106 similarly to the second conductor 102, and the second interconnect 112 is provided in the inside of the second opening 106.

As shown in FIG. 12, the A layer 11 and the B layer 12 may include conductor elements other than the structural body 10, for example, other power planes (second power plane 401, fourth power plane 402 and the like), a transmission line that transmits a signal, and the like. In addition, the interconnect substrate 100 may include layers different from the A layer 11 and the B layer 12, and may include components other than the above-mentioned components, for example, a ground plane, a power plane, a transmission line, and the like in these layers. For example, a dielectric layer may be provided between the A layer 11 and the B layer 12.

In the interconnect substrate 100 of the embodiment, the first power plane 101' of the A layer 11 and the third power plane 102' of the B layer 12 are used as the first conductor 101 and the second conductor 102 of the above-mentioned structural body 10, and thus an EBG structure is formed including the first power plane 101', the third power plane 102', the first interconnect 111, the first opening 105, the second interconnect 112, the second opening 106, and the conductor via 121. With such a configuration, the interconnect substrate 100 of the embodiment can suppress noise propagation between parallel plates formed by the first power plane 101' and the third power plane 102' and noise resonance in the parallel plates.

When the noise resonance in the parallel plate is suppressed, the structural body 10 is preferably disposed in the vicinity of a region having a maximum voltage magnitude between the parallel plates due to the resonance, but the essential effect of the invention is not influenced at all even in the case where the structural body 10 is disposed in another place.

In addition, in FIG. 12, a case is shown in which one structural body 10 is provided in the interconnect substrate 100, but a plurality of structural bodies 10 may be disposed in accordance with a noise propagation path or a noise resonance mode. Particularly, as shown in FIG. 13, when the structural bodies 10 are repeatedly disposed, a wider-band noise propagation suppressing effect can be obtained by the occurrence of Bragg reflection based on repeated periodicity in addition to the essential effect of the structural body 10.

Herein, when the "repeated" structural bodies 10 are disposed, it is preferable that the distance (center-to-center distance) between the conductor vias 121 is set to be within ½ of wavelength λ of targeting electromagnetic waves, in the structural bodies 10 adjacent to each other. In addition, "repeated" also includes a case where a portion of the configuration is missing in any of the structural bodies 10. In addition, when the structural bodies 10 have a two-dimensional array, "repeated" also includes a case where the structural bodies 10 are partially missing. In addition, "periodic" also includes a case where a portion of the components is out of alignment in some structural bodies 10, or a case where the disposition of some structural bodies 10 in themselves is out of alignment. That is, even when periodicity in a strict sense collapses, the characteristics as a metamaterial can be obtained in a case where the structural bodies 10 are repeatedly disposed, and thus some degree of defects is allowed in the "periodicity". Meanwhile, it is considered that factors for which these defects are generated include a case of passing the interconnect, the vias, or the connecting members between the structural bodies 10, a case where the unit cells cannot be disposed due to the existing vias, patterns, or connecting members, when a metamaterial structure is added to the existing interconnect layout or inter-substrate connection structure, manufacturing errors, and a case where the existing vias, patterns, or connecting members are used as a portion of the unit cell 10, and the like. Such a premise is the same as that in the following all the embodiments.

Figure 13:
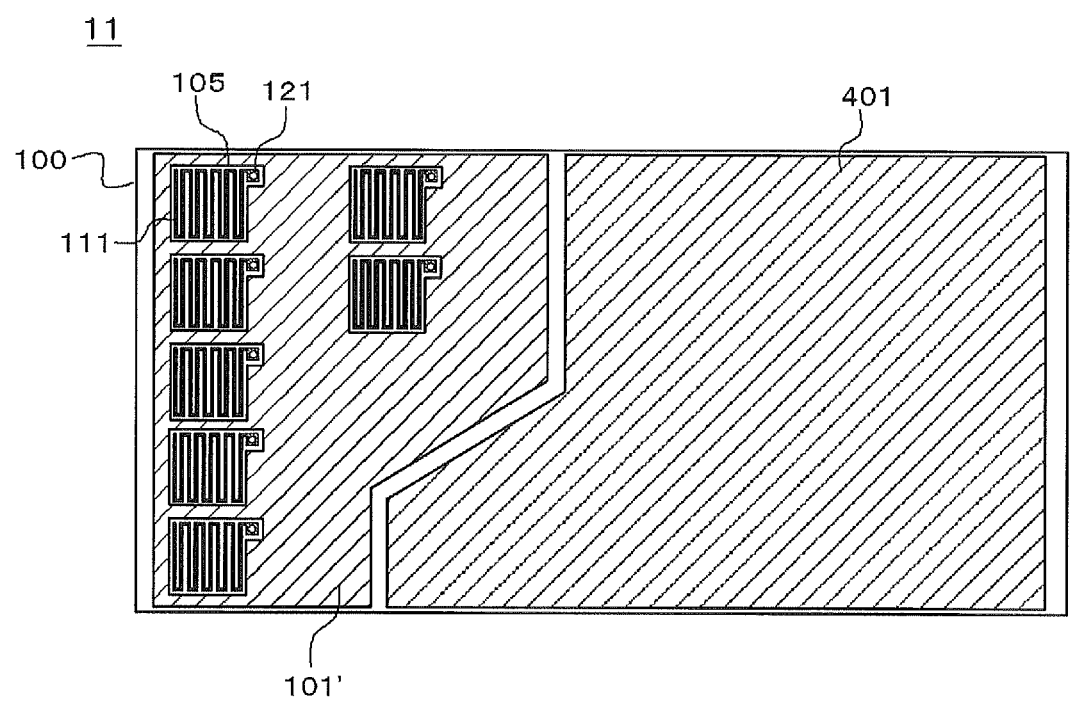
FIG. 13 is a top view illustrating an example of the interconnect substrate according to the fourth embodiment.

Meanwhile, in FIG. 13, an example is shown in which a plurality of first openings 105 and first interconnects 111 are provided in the A layer 11, but a plurality of second openings 106 and second interconnects 112 can also be provided in the B layer 12 similarly.

In addition, in the embodiment, as a mounting example in the actual interconnect substrate 100, the configuration is illustrated in which a power plane is used as the first conductor 101 and the second conductor 102 which are included in the structural body 10, but is not necessarily limited to such a configuration. For example, a configuration can also be made in which the first conductor 101 is a power plane and the second conductor 102 is a ground plane.

<Fifth Embodiment>

Figure 14:
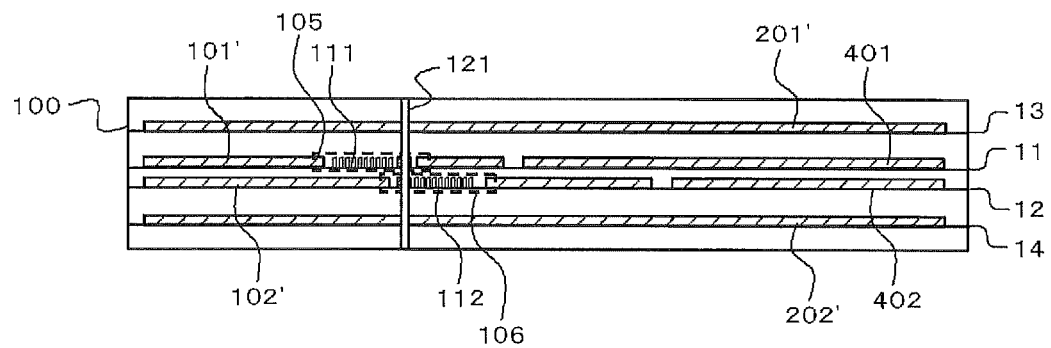
FIG. 14 is a cross-sectional view illustrating an example of an interconnect substrate according to a fifth embodiment.

FIG. 14 is a cross-sectional view illustrating an example of the interconnect substrate 100 according to a fifth embodiment. The fifth embodiment has the same configuration as that of the interconnect substrate 100 according to the fourth embodiment, except that a first ground plane 201' and a second ground plane 202' are included.

Meanwhile, the fifth embodiment is an embodiment in which the structural body 10 described in the second embodiment is constituted by various types of conductive components formed in the interconnect substrate 100.

Hereinafter, the interconnect substrate 100 will be described in detail. Meanwhile, a description of the same configurations as those of the second and the fourth embodiments will not be repeated.

As shown in FIG. 14, similarly to the fourth embodiment, the interconnect substrate 100 according to the embodiment is configured such that the first power plane 101' and the second power plane 401 are disposed in the A layer 11, and the third power plane 102' and the fourth power plane 402 are disposed in the B layer 12 located below the A layer. Meanwhile, the configurations of the A layer 11 and the B layer 12 are the same as those of the fourth embodiment.

The interconnect substrate 100 according to the embodiment is configured such that the first ground plane 201' is disposed in the C layer 13 located above the A layer 11. In addition, the interconnect substrate 100 according to the embodiment is configured such that the second ground plane 202' is disposed in the D layer 14 located below the B layer 12.

Meanwhile, the first ground plane 201' is equivalent to the third conductor 201 in the structural body 10 of the second embodiment. The first power plane 101' is equivalent to the first conductor 101 in the structural body 10 of the second embodiment. The third power plane 102' is equivalent to the second conductor 102 in the structural body 10 of the second embodiment. The second ground plane 202' is equivalent to the fourth conductor 202 in the structural body 10 of the second embodiment.

As shown in FIG. 14, the C layer 13, the A layer 11, the B layer 12, and the D layer 14 may include conductor elements other than the structural body 10, for example, other power planes, a transmission line that transmits a signal, and the like. In addition, the interconnect substrate 100 may include layers different from the C layer 13, the A layer 11, the B layer 12, and the D layer 14, and may include components the above-mentioned components, for example, a ground plane, a power plane, a transmission line and the like in these layers. For example, a dielectric layer may be provided between the C layer 13 and the A layer 11, between the A layer 11 and the B layer 12, and between the B layer 12 and the D layer 14.

In the interconnect substrate 100 of the embodiment, the first ground plane 201' of the C layer 13, the first power plane 101' of the A layer 11, the third power plane 102' of the B layer 12, and the second ground plane 202' of the D layer 14 are used as the third conductor 201, the first conductor 101, the second conductor 102, and the fourth conductor 202 of the above-mentioned structural body 10, respectively, and thus an EBG structure is formed including the first ground plane 201', the first power plane 101', the third power plane 102', the second ground plane 202', the first interconnect 111, the first opening 105, the second interconnect 112, the second opening 106, and the conductor via 121. With such a configuration, the interconnect substrate 100 of the embodiment can suppress noise propagation between first parallel plates formed by the first ground plane 201' and the first power plane 101' and noise resonance in the first parallel plates. In addition, the interconnect substrate can suppress noise propagation between second parallel plates formed by the first power plane 101' and the third power plane 102' and noise resonance in the second parallel plates. In addition, the interconnect substrate can suppress noise propagation between third parallel plates formed by the third power plane 102' and the second ground plane 202' and noise resonance in the third parallel plates.

When the noise resonance in the parallel plate is suppressed, the structural body 10 is preferably disposed in the vicinity of a region having a maximum voltage magnitude between the parallel plates due to the resonance, but the essential effect of the invention is not influenced at all even in the case where the structural body 10 is disposed in another place.

In addition, in FIG. 14, a case is shown in which one structural body 10 is provided in the interconnect substrate 100, but a plurality of structural bodies 10 may be disposed in accordance with a noise propagation path or a noise resonance mode. Particularly, when the structural bodies 10 are repeatedly disposed, a wider-band noise propagation suppressing effect can be obtained by the occurrence of Bragg reflection based on repeated periodicity in addition to the essential effect of the structural body 10.

In addition, in the embodiment, as a mounting example in the actual interconnect substrate 100, a configuration is illustrated in which a power plane is used as the first conductor 101 and the second conductor 102, and a ground plane is used as the third conductor 201 and the fourth conductor 202, but is not necessarily limited to such a configuration.

<Sixth Embodiment>

Figure 15:
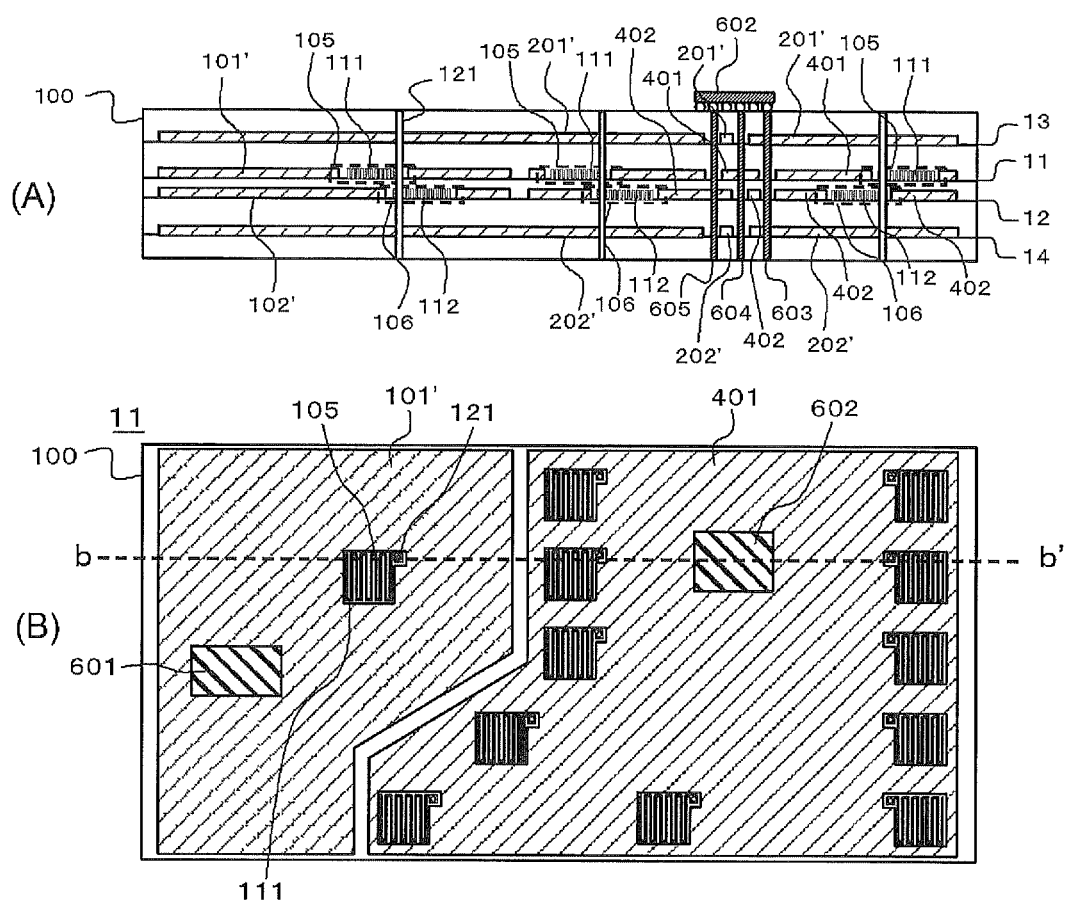
FIG. 15 is a cross-sectional view and a top view illustrating an example of an interconnect substrate according to a sixth embodiment.

FIG. 15 is a top view and a cross-sectional view illustrating an example of the interconnect substrate 100 according to a sixth embodiment. More specifically, FIG. 15(B) is a top view illustrating the A layer 11 of the interconnect substrate 100, and FIG. 15(A) is a cross-sectional view in the section b-b' shown in FIG. 15(B).

As shown in FIG. 15(A), the layer configuration of the interconnect substrate 100 according to the embodiment is the same as that of the fifth embodiment. Further, an analog electronic element 601 that processes an analog signal and a digital electronic element 602 that processes a digital signal are mounted onto the surface layer of the interconnect substrate 100 according to the embodiment.

A ground terminal of the digital electronic element 602 is connected to a ground via 603, and the ground via 603 is connected to the first ground plane 201' and the second ground plane 202'. Meanwhile, the ground via 603 passes through an opening provided in each of the second power plane 401 and the fourth power plane 402 in a state of non-contact with the second power plane 401 and the fourth power plane 402. That is, the ground via 603 is insulated from the second power plane 401 and the fourth power plane 402.

In addition, a power supply terminal of the digital electronic element 602 is connected to a first power supply via 604, and the first power supply via 604 is connected to the second power plane 401. Meanwhile, the first power supply via 604 passes through an opening provided in each of the first ground plane 201', the fourth power plane 402 and the second ground plane 202' in a state of non-contact with the first ground plane 201', the fourth power plane 402 and the second ground plane 202'. That is, the first power supply via 604 is insulated from the first ground plane 201', the fourth power plane 402 and the second ground plane 202'.

In addition, the other power supply terminal of the digital electronic element 602 is connected to a second power supply via 605, and the second power supply via 605 is connected to the fourth power plane 402. Meanwhile, the second power supply via 605 passes through an opening provided in each of the first ground plane 201', the second power plane 401 and the second ground plane 202' in a state of non-contact with the first ground plane 201', the second power plane 401 and the second ground plane 202'. That is, the second power supply via 605 is insulated from the first ground plane 201', the second power plane 401 and the second ground plane 202'.

In addition, aground terminal, not shown of the analog electronic element 601 is connected to the first ground plane 201' and the second ground plane 202', and is insulated from the first power plane 101' and the third power plane 102'. In addition, a power supply terminal, not shown, of the analog electronic element 601 is connected to the first power plane 101', and is insulated from the first ground plane 201', the third power plane 102' and the second ground plane 202'. In addition, the other power supply terminal, not shown, of the analog electronic element 601 is connected to the third power plane 102', and is insulated from the first ground plane 201', the first power plane 101' and the second ground plane 202'. Such a configuration can be realized similarly to a unit that connects the digital electronic element 602 and each plane mentioned above.

Meanwhile, the first ground plane 201' is equivalent to the third conductor 201 in the structural body 10 of the second embodiment. The first power plane 101' and the second power plane 401 are equivalent to the first conductor 101 in the structural body 10 of the second embodiment. The third power plane 102' and the fourth power plane 402 are equivalent to the second conductor 102 in the structural body 10 of the second embodiment. The second ground plane 202' is equivalent to the fourth conductor 202 in the structural body 10 of the second embodiment.

That is, in the embodiment, not only the first power plane 101' but also the second power plane 401 have the first opening 105 similarly to the first conductor 101, and the first interconnect 111 is provided in the inside of the first opening 105. In addition, in the embodiment, not only the third power plane 102' but also the fourth power plane 402 have the second opening 106 similarly to the second conductor 102, and the second interconnect 112 is provided in the inside of the second opening 106.

Meanwhile, the C layer 13, the A layer 11, the B layer 12, and the ID layer 14 may include conductor elements other than the structural body 10, for example, other power planes, a transmission line that transmits a signal, and the like. In addition, the interconnect substrate 100 may include layers different from the C layer 13, the A layer 11, the B layer 12, and the ID layer 14, and may include components other than the above-mentioned components, for example, a ground plane, a power plane, a transmission line and the like in these layers. For example, a dielectric layer may be provided between the C layer 13 and the A layer 11, between the A layer 11 and the B layer 12, and between the B layer 12 and the D layer 14.

At least a portion of noise generated in the digital electronic element 602 propagates through the ground via 603, the first power supply via 604, and the second power supply via 605 to the first parallel plates formed by the first ground plane 201' and the second power plane 401, the second parallel plates formed by the second power plane 401 and the fourth power plane 402, and the third parallel plates formed by the fourth power plane 402 and the second ground plane 202'.

In such a case, the noise propagating to the above-mentioned parallel plates reaches the analog electronic element 601 directly, or indirectly through emission from the parallel plate ends, and thus there is a concern of causing the reduced receiving sensitivity or malfunction of the analog electronic element 601. The interconnect substrate 100 of the embodiment is configured to solve the above problem.

That is, in a region (hereinafter, referred to as the "digital region"), of the interconnect substrate 100 according to the embodiment, in which the second power plane 401 or the fourth power plane 402 connected to the digital electronic element 602 extends, the first ground plane 201' of the C layer 13, the second power plane 401 of the A layer 11, the fourth power plane 402 of the B layer 12, and the second ground plane 202' of the D layer 14 are used as the third conductor 201, the first conductor 101, the second conductor 102, and the fourth conductor 202 of the above-mentioned structural body 10, respectively, and thus an EBG structure is formed including the first ground plane 201', the second power plane 401, the fourth power plane 402, the second ground plane 202', the first interconnect 111, the first opening 105, the second interconnect 112, the second opening 106, and the conductor via 121. Such a configuration can cause the noise generated in the digital electronic element 602 not to propagate to the region (hereinafter, referred to as the "analog region") side on which the first power plane 101' or the third power plane 102' connected to the analog electronic element 601 extends.

In addition, in the analog region of the interconnect substrate 100 according to the embodiment, the first ground plane 201' of the C layer 13, the first power plane 101' of the A layer 11, the third power plane 102' of the B layer 12, and the second ground plane 202' of the D layer 14 are used as the third conductor 201, the first conductor 101, the second conductor 102, and the fourth conductor 202 of the above-mentioned structural body 10, respectively, and thus an EBG structure is formed including the first ground plane 201', the first power plane 101', the third power plane 102', the second ground plane 202', the first interconnect 111, the first opening 105, the second interconnect 112, the second opening 106, and the conductor via 121. Such a configuration can cause the noise propagating from the digital region not to propagate to the analog electronic element 601.

As shown in FIG. 15, a plurality of structural bodies 10 are preferably disposed so as to surround at least one of the analog electronic element 601 or the digital electronic element 602 when seen in a plan view. However, when at least one structural body is disposed in the periphery of at least one of the analog electronic element 601 or the digital electronic element 602, the essential effect of the invention can be obtained. Therefore, the arrangement pattern of the structural body 10 can take a plurality of aspects.

In addition, in the embodiment, as an example of an electronic element to be protected from noise, the analog electronic element 601 has been described by way of example. However, when the electronic element is a part or a circuit of which the performance deteriorates due to the influence of noise, any configuration may be used therefor. For example, an antenna and the like can also be considered. In addition, in the embodiment, as an example of an electronic element that generates noise, the digital electronic element 602 has been described by way of example. However, when the electronic element is a part or a circuit that generates noise, any configuration may be used therefor. For example, a power supply circuit and the like can also be considered.

Meanwhile, the embodiment and a plurality of modified examples mentioned above can be naturally combined in the range consistent with the contents thereof. In addition, in the embodiments and modified examples mentioned above, although the function and the like of each component have been specifically described, it is possible to variously change the function and the like in the range that satisfies the invention.

The application claims priority from Japanese Patent Application No. 2010-216567 filed on Sep. 28, 2010, the content of which is incorporated herein by reference in its entirety.

The invention claimed is:

1. A structural body, comprising:
   a first conductor including a plurality of first openings;
   a second conductor, including a plurality of second openings, which is opposite to at least a portion of the first conductor;
   a plurality of conductor vias, passing through the first opening and the second openings, which are insulated from the first conductor and the second conductor;
   a plurality of first interconnects, provided in an inside of the first openings, of which one end thereof is connected to the conductor vias and an other end thereof is formed as an open end, and which is opposite to the second conductor;
   a plurality of second interconnects, provided in an inside of the second opening, of which one end thereof is connected to the conductor vias and an other end thereof is formed as an open end, and which are opposite to the first conductors; and
   a third conductor which is opposite to at least a portion of the first conductor and is located at the opposite side to the second conductor with respect to the first conductor,
   wherein the third conductor is connected to the conductor vias,
   wherein a plurality of electromagnetic band gap (EBG) structures are formed by the first conductor, the second conductor, the third conductor, the plurality of conductor vias, the plurality of first interconnects, and the plurality of second interconnects.

2. The structural body according to claim 1, wherein the first interconnects and the second interconnects form a microstrip line using the second conductor and the first conductor as a return path.

3. The structural body according to claim 1, wherein at least one set of the plurality of the first interconnects and the plurality of the second interconnects is provided in the inside of the first openings or the second openings.

4. The structural body according to claim 1, wherein the other end of at least one of the first interconnects and the second interconnects is branched.

5. The structural body according to claim 1, wherein the third conductor includes an opening at a position overlapping the first interconnects when seen in a plan view.

6. The structural body according to claim 1, further comprising a fourth conductor which is opposite to at least a portion of the second conductor and is located at an opposite side to the first conductor with respect to the second conductor, wherein the fourth conductor is connected to the conductor vias.

7. The structural body according to claim 6, wherein the fourth conductor includes an opening at a position overlapping the second interconnects when seen in a plan view.

8. An interconnect substrate comprising a laminated structure formed including an electric conductor and a dielectric, wherein the interconnect substrate includes at least one of structural bodies according to claim 1 within the laminated structure.

9. The interconnect substrate according to claim 8, wherein the at least one of the structural bodies is repeatedly arranged.

10. The interconnect substrate according to claim 8, further comprising at least one electronic element, wherein at least one of the first conductor and the second conductor is connected to a ground terminal or a power supply terminal of the electronic element.

11. The structural body according to claim 2, wherein at least one set of the plurality of the first interconnects and the plurality of the second interconnects is provided in the inside of the first openings or the second openings.

12. The structural body according to claim 2, wherein the other end of at least one of the first interconnects and the second interconnects is branched.

13. The structural body according to claim 3, wherein the other end of at least one of the first interconnects and the second interconnects is branched.

14. The structural body according to claim 1, wherein the first openings include a first area which is opposite to the second conductor, the first interconnects existing within the first area, and wherein the second openings include a second area which is opposite to the first conductor, the second interconnects existing within the second area.

15. The structural body according to claim 1, wherein the plurality of EBG structures are formed by a single conductor of the third conductor.

16. The structural body according to claim 1, wherein the plurality of EBG structures are formed by a single one of the third conductor.

17. The structural body according to claim 1, wherein the plurality of EBG structures are formed by only one said third conductor.

\* \* \* \* \*